(12) United States Patent
Yang et al.

(10) Patent No.: US 9,043,684 B2
(45) Date of Patent: May 26, 2015

(54) SYSTEMS AND METHODS FOR VARIABLE REDUNDANCY DATA PROTECTION

(75) Inventors: Shaohua Yang, Santa Clara, CA (US); Lav D. Ivanovic, Sunnyvale, CA (US); Fan Zhang, Milpitas, CA (US); Douglas M. Hamilton, Littleton, CO (US)

(73) Assignee: LSI Corporation, San Jose, CA (US)

( * ) Notice: Subject to any disclaimer, the term of this patent is extended or adjusted under 35 U.S.C. 154(b) by 563 days.

(21) Appl. No.: 13/426,693

(22) Filed: Mar. 22, 2012

(65) Prior Publication Data

US 2013/0254623 A1    Sep. 26, 2013

(51) Int. Cl.
| | |
|---|---|
| H03M 13/11 | (2006.01) |
| H03M 13/29 | (2006.01) |
| G11B 20/18 | (2006.01) |
| H03M 13/53 | (2006.01) |
| G06F 11/10 | (2006.01) |
| G11B 20/10 | (2006.01) |
| H03M 5/14 | (2006.01) |
| H03M 13/00 | (2006.01) |

(52) U.S. Cl.
CPC ....... *H03M 13/2906* (2013.01); *G06F 11/1076* (2013.01); *G11B 20/1833* (2013.01); *G11B 2020/10888* (2013.01); *G11B 2020/185* (2013.01); *G11B 2220/2516* (2013.01); *H03M 5/145* (2013.01); *H03M 13/1102* (2013.01); *H03M 13/2957* (2013.01); *H03M 13/6343* (2013.01); *H03M 13/6516* (2013.01)

(58) Field of Classification Search
CPC ... H04L 1/0057; H04L 1/0061; H04L 1/0009; H04L 1/0045; H03M 13/09; H03M 13/116; H03M 13/2906; H03M 5/145; H03M 13/1102; H03M 13/2957; H03M 13/6343; H03M 13/6516; G06F 11/1068; G06F 11/1072; G06F 11/1076; G11B 20/1833; G11B 2020/10888; G11B 2020/185; G11B 2220/2516

See application file for complete search history.

(56) References Cited

U.S. PATENT DOCUMENTS

| | | | |
|---|---|---|---|
| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |
| 5,417,500 | A | 5/1995 | Martinie |
| 5,513,192 | A | 4/1996 | Janku |
| 5,523,903 | A | 6/1996 | Hetzler |
| 5,550,810 | A | 8/1996 | Monogioudis et al. |
| 5,550,870 | A | 8/1996 | Blaker |
| 5,612,964 | A | 3/1997 | Haraszti |
| 5,710,784 | A | 1/1998 | Kindred |
| 5,717,706 | A | 2/1998 | Ikeda |
| 5,802,118 | A | 9/1998 | Bliss |
| 5,844,945 | A | 12/1998 | Nam |
| 5,898,710 | A | 4/1999 | Amrany |

(Continued)

OTHER PUBLICATIONS

Casado et al., Multiple-rate low- density parity-check codes with constant blocklength, IEEE Transations on communications, Jan. 2009, vol. 57, pp. 75-83.

(Continued)

*Primary Examiner* — April Y Blair
*Assistant Examiner* — Dipakkumar Gandhi
(74) *Attorney, Agent, or Firm* — Hamilton DeSanctis & Cha

(57) ABSTRACT

The present inventions are related to systems and methods for data processing, and more particularly to systems and methods for variable rate coding in a data processing system.

19 Claims, 10 Drawing Sheets

(56) References Cited

U.S. PATENT DOCUMENTS

| | | | |
|---|---|---|---|
| 5,923,713 A | 7/1999 | Hatakeyama | |
| 5,978,414 A | 11/1999 | Nara | |
| 5,983,383 A * | 11/1999 | Wolf | 714/755 |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,185,102 B1 * | 2/2007 | Swaminathan et al. | 709/231 |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,734,456 B2 * | 6/2010 | Fujita | 703/13 |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,291,284 B2 | 10/2012 | Savin | |
| 8,295,001 B2 | 10/2012 | Liu | |
| 2002/0159454 A1* | 10/2002 | Delmas | 370/389 |
| 2003/0074130 A1* | 4/2003 | Negishi et al. | 701/200 |
| 2003/0112821 A1* | 6/2003 | Cleveland et al. | 370/468 |
| 2004/0128191 A1* | 7/2004 | Kotzin | 705/14 |
| 2006/0251176 A1* | 11/2006 | Hatabu et al. | 375/240.27 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0164863 A1* | 6/2009 | Oh et al. | 714/752 |
| 2009/0185643 A1 | 7/2009 | Fitzpatrick | |
| 2011/0167227 A1 | 7/2011 | Yang | |
| 2011/0264987 A1 | 10/2011 | Li | |
| 2012/0089877 A1* | 4/2012 | Takeuchi et al. | 714/719 |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. Jan. 1, 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsŝi: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/369,468, filed Feb. 9, 2012, Zongwang Li, Unpublished.

U.S. Appl. No. 13/269,852, filed Oct. 10, 2011, Haitao Xia, Unpublished.

U.S. Appl. No. 13/284,730, filed Oct. 28, 2011, Fan Zhang, Unpublished

U.S. Appl. No. 13/295,150, filed Nov. 14, 2011, Zongwang Li, Unpublished.

U.S. Appl. No. 13/284,767, filed Oct. 28, 2011, Fan Zhang, Unpublished.

U.S. Appl. No. 13/269,832, filed Oct. 10, 2011, Haitao Xia, Unpublished.

U.S. Appl. No. 13/227,544, filed Sep. 8, 2011, Shaohua Yang, Unpublished.

U.S. Appl. No. 13/239,683, filed Sep. 22, 2011, Changyou Xu, Unpublished.

(56) References Cited

OTHER PUBLICATIONS

U.S. Appl. No. 13/186,234, filed Jul. 19, 2011, Haitao Xia, Unpublished.
U.S. Appl. No. 13/174,453, filed Jun. 30, 2011, Johnson Yen, Unpublished.
U.S. Appl. No. 13/174,537, filed Jun. 30, 2011, Anantha Raman Krishnan, Unpublished.
U.S. Appl. No. 13/283,549, filed Oct. 27, 2011, Wu Chang, Unpublished.
U.S. Appl. No. 13/296,022, filed Nov. 14, 2011, Victor Krachkovsky, Unpublished.
U.S. Appl. No. 13/305,551, filed Nov. 28, 2011, Yang Han, Unpublished.
U.S. Appl. No. 13/227,416, filed Sep. 7, 2011, Lei Chen, Unpublished.
U.S. Appl. No. 13/305,510, filed Nov. 28, 2011, Lei Chen, Unpublished.
U.S. Appl. No. 13/302,119, filed Nov. 22, 2011, Lei Chen, Unpublished.
U.S. Appl. No. 13/340,951, filed Dec. 30, 2011, Lei Chen, Unpublished.
U.S. Appl. No. 13/300,078, filed Nov. 18, 2011, Chung-Li Wang, Unpublished.
U.S. Appl. No. 13/180,495, filed Jul. 11, 2011, Chung-Li Wang, Unpublished.
U.S. Appl. No. 13/213,751, filed Aug. 19, 2011, Fan Zhang, Unpublished.
U.S. Appl. No. 13/415,326, filed Mar. 8, 2012, Shaohua Yang, Unpublished.
U.S. Appl. No. 13/113,219, filed May 23, 2011, Yang Han, Unpublished.
U.S. Appl. No. 13/340,974, filed Dec. 30, 2011, Dan Liu, Unpublished.
U.S. Appl. No. 13/171,615, filed Jun. 29, 2011, Bradley D. Seago, Unpublished.
U.S. Appl. No. 13/415,430, filed Mar. 8, 2012, Nayak Ratnakar Aravind, Unpublished.
U.S. Appl. No. 13/422,986, filed Mar. 16, 2012, Fan Zhang, Unpublished.
U.S. Appl. No. 13/412,520, filed Mar. 5, 2012, Fan Zhang, Unpublished.
U.S. Appl. No. 13/362,409, filed Jan. 31, 2012, Fan Zhang, Unpublished.
U.S. Appl. No. 13/316,858, filed Dec. 12, 2011, Zongwang Li, Unpublished.
U.S. Appl. No. 13/316,741, filed Dec. 12, 2011, Yang Han, Unpublished.
U.S. Appl. No. 13/327,279, filed Dec. 15, 2011, Wei Feng, Unpublished.
U.S. Appl. No. 13/372,580, filed Feb. 14, 2012, Fan Zhang, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999
Xiao, et al "Nested Codes With Multiple Interpretations" retrieved from the Internet URL: http://www.ece.nrnsu.edu/~jkliewer/paper/XFKC_CISS06.pdf (retrieved on Dec. 5, 201.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR VARIABLE REDUNDANCY DATA PROTECTION

BACKGROUND OF THE INVENTION

The present inventions are related to systems and methods for data processing, and more particularly to systems and methods for variable rate coding in a data processing system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, the originally written data sets are different lengths and yet they use the same bandwidth for a transfer/store. Such an approach results in a waste of bandwidth.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for variable rate coding in a data processing system.

Various embodiments of the present invention provide systems that include a transfer controller circuit. The transfer controller circuit is operable to provide a write request to a storage device. The write request indicates a data set to be provided to the storage device, and the data transfer controller circuit is further operable to vary the length of the data set to vary an amount of redundancy stored to the storage device in relation to the data set. In some instances of the aforementioned embodiments, the length is varied between a first length and a second length with the second length being greater than the first length. The first length is selected by the data transfer controller circuit based upon a type of data included in the data set. In some cases, the second length is selected when the data set is a second data type that is resilient (i.e., less impacted by) to errors, and the first length is selected when the data set is a first data type that is not resilient (i.e., more impacted by) to errors. In some such cases, the second data type may be, for example, audio data or video data. The first data type may be, for example, an executable application.

In some instances of the aforementioned embodiments, the data transfer controller circuit is implemented as part of a microprocessor based system including a microprocessor and a memory. The memory includes instructions executable by the microprocessor to assign a processing importance, and the data transfer controller circuit is operable to vary the length of the data set based at least in part on the processing importance. In some such cases, the microprocessor based system further includes an importance data map operable to store the assigned processing importance in relation to the portion of the data set.

Other embodiments of the present invention provide methods for data transfer that include: selecting a data set for transfer; determining an importance of the data set; based at least in part on the determined importance, and segregating a length of the data set to yield a transfer unit; and providing the transfer unit to a transfer device. The length is selected based at least in part on the importance; and providing the transfer unit to a transfer device. In some instances of the aforementioned embodiments, the transfer device is a storage device operable to encode and store the transfer unit. In other cases, the transfer device is a communication device operable to encode and transmit the transfer unit. In particular cases, the importance may be, for example, a high importance or a low importance. In such cases, the length is selected as a first length when the data set is a first data type that is resilient to errors; and the length is selected as a second length when the data set is a second data type that is not resilient to errors. The second length is shorter than the first length.

Yet other embodiments of the present invention provide communication systems having a microprocessor based system operable to format a data set for transfer to a communication device. The microprocessor based system includes a microprocessor and a memory, and the memory includes instructions executable by the microprocessor to: receive a data set for transmission; determine a data type of the data set; select a length of the data set based at least in part on the data type; segregate a portion of the data set as a transfer data set, wherein the transfer data set is the selected length; and provide the transfer data set to the communication device.

Various other embodiments of the present invention provide data processing systems including a processing circuit, an encoder circuit, and a variable length encoding selection circuit. The processing circuit is operable to determine a length of a transfer data set. The encoder circuit includes at least a first encoder and a second encoder. The first encoder is operable to generate a first size of added encoding when applied to the transfer data set and the second encoder is operable to generate a second size of added encoding when applied to the transfer data set. The variable length encoding selection circuit operable to select one of the first encoder and the second encoder based at least in part on the length of the transfer data set. In some instances of the aforementioned embodiments, the system is implemented as an integrated circuit. In various instances of the aforementioned embodiments, the data processing system is incorporated in a storage device. In other instances of the aforementioned embodiments, the data processing system is incorporated in a data transmission device. In some cases, the first encoder is a first run length limited encoding circuit, and the second encoder is a second run length limited encoding circuit. In other cases, the first encoder is a first encryption circuit, and the second encoder is a second encryption circuit.

In some instances of the aforementioned embodiments, the encoder circuit is operable to generate a first level encoded output of a defined length whether the first encoder or the second encoder is selected. In various instances of the aforementioned embodiments, the encoder circuit is operable to generate a first level encoded output includes a combination of information derived from: the transfer data set, added encoding generated by the selected one of the first encoder and the second encoder; and an indication of the selected one of the first encoder and the second encoder. In one or more instances of the aforementioned embodiments, the data processing system further includes a data compression circuit operable to compress an input data set to yield the transfer data set. In other instances of the aforementioned embodiments, the transfer data set is an uncompressed data set received from a host controller.

In particular instances of the aforementioned embodiments, the encoder circuit is operable to generate a first level encoded output. In such instances, the data processing system further includes a low density parity check encoding circuit operable to apply a low density parity check encoding to the first level encoded output to yield a codeword. In some cases, the data processing system further includes: a low density parity check data decoder circuit, a decoder circuit, and a decoder selection circuit. The low density parity check data decoder circuit is operable to decode a decoder input derived from the codeword to yield the first level encoded output. The first level encoded output includes a combination of information derived from: the transfer data set; added encoding generated by the selected one of the first encoder and the second encoder; and an indication of the selected one of the first encoder and the second encoder. The decoder circuit includes at least a first decoder corresponding to the first encoder and a second decoder corresponding to the second encoder. The decoder selection circuit is operable to select one of the first encoder and the second encoder based on the indication of the selected one of the first encoder and the second encoder.

Other embodiments of the present invention provide methods for data processing. The methods include: receiving a transfer data set; determining a length of the transfer data set; and selecting one of at least a first encoder and a second encoder based at least in part on the length of the transfer data set. The first encoder is operable to apply a first encoding algorithm to the yield a first size of added encoding when applied to the transfer data set, and the second encoder is operable to apply a second encoding algorithm to the yield a second size of added encoding when applied to the transfer data set. The methods further include applying a selected encoding algorithm to the transfer data set to yield added encoding. The selected encoding algorithm is the encoding algorithm of the selected one of the first encoder and the second encoder.

In some instances of the aforementioned embodiments, the methods further include generating a first level encoded output, wherein the first level encoded output includes a combination of information derived from: the transfer data set; the added encoding; and an indication of the selected one of the first encoder and the second encoder. In some such instances, the methods further include applying a low density parity check encoding to the first level encoded output to yield a codeword. In some such instances, the methods further include applying a low density parity check decoding algorithm to a decoder input derived from the codeword to yield the first level encoded output. The first level encoded output includes a combination of information derived from: the transfer data set; the added encoding generated by the selected one of the first encoder and the second encoder; and an indication of the selected one of the first encoder and the second encoder. The methods further include selecting one of a first decoder corresponding to the first encoder and a second decoder corresponding to the second encoder based on the indication of the selected one of the first encoder and the second encoder.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 3b-3c show example variably encoded codewords that may be generated using the data encoding circuit of FIG. 3a;

FIGS. 5b-5c show example variably encoded codewords that may be generated using the data encoding circuit of FIG. 5a;

DETAILED DESCRIPTION OF THE INVENTION

The present inventions are related to systems and methods for data processing, and more particularly to systems and methods for variable rate coding in a data processing system.

Various embodiments of the present invention provide for data processing that includes utilizing codeword length for encoding information. In some cases, an encoding algorithm is selected based upon a length of a transfer data set. The selected encoding algorithm provides first level encoder added information exhibiting a length that when combined with a transfer data set substantially uses a data packet of a defined length. In addition, one or more bits of the data packet indicate the encoder selected to perform the first level encoding. The data packet is then encoded using a second level encoding to yield a codeword. A decoding circuit applies a decoding algorithm to the codeword that reverses the second level encoding to yield the data packet. The bits from the data packet indicating the encoder selected to perform the first level encoding are accessed and used to select a decoding algorithm to be applied to the data packet to yield the original transfer data set.

Figure 1:
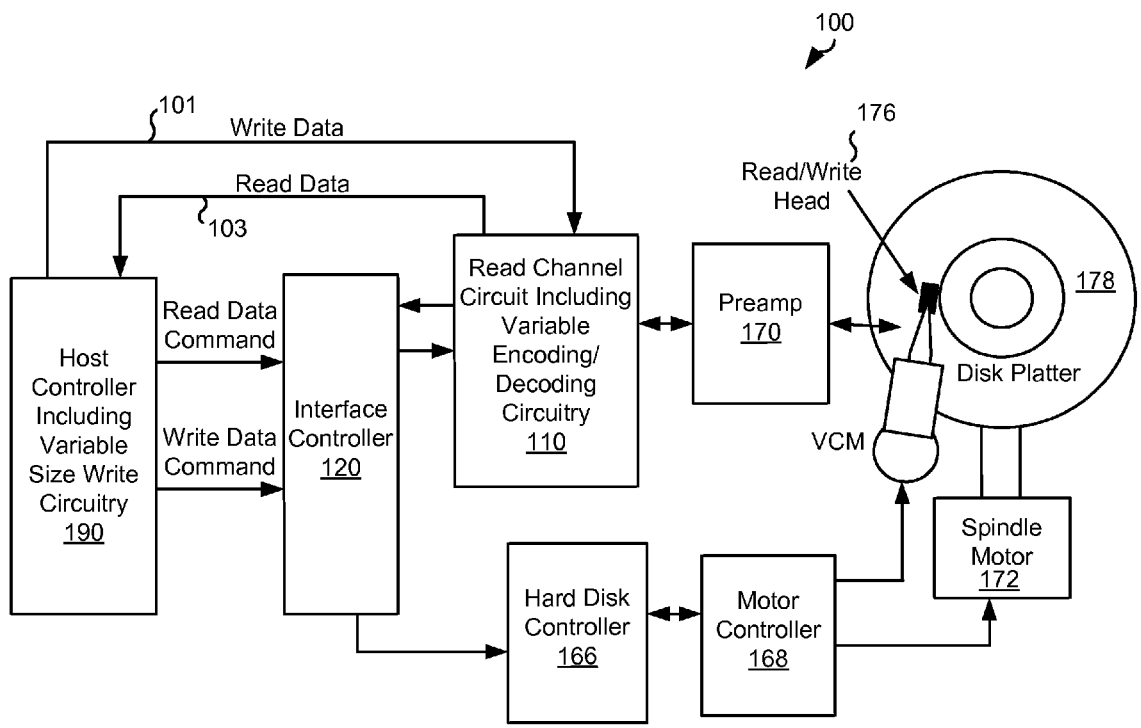
FIG. 1 shows a storage system including variable size encoding/decoding circuitry in accordance with various embodiments of the present invention.

Turning to FIG. 1, a storage system 100 including a read channel circuit 110 having including variable size encoding/decoding circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

Storage system 100 is accessed (i.e., read and written) based upon instructions received from a host controller 190. Host controller 190 includes variable size write circuitry operable to provide data sets of one or more lengths along with a write command where the write data set(s) are to be written to disk platter 178; and to receive data sets of variable length that are derived from disk platter 178. In a typical read operation, host controller 190 provides a read command to interface controller 120 that includes an indication of a data block to be read from disk platter 178. In return, read channel circuit 110 provides the requested data as read data 103. In a typical write operation, host controller 190 provides a transfer data set as write data 101 and a write command indicating where on disk platter 178 an encoded version of the transfer data set is to be written.

In response to the request received from host controller 190, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to host controller 190. A write operation is different in that host controller 190 provides write data 190 to read channel circuit 110 that proceeds to encode and write the data to disk platter 178 using hard disk controller 166, motor controller 168, read/write head assembly 176, and spindle motor 172 to effectuate the write to the desired location.

As part of processing the received information, read channel circuit 110 utilizes variable length encoding/decoding circuitry that performs variable length encoding/decoding in accordance with some embodiments of the present invention. In some cases, read channel circuit 110 may be implemented to include a data encoding/decoding circuitry similar to that discussed below in relation to FIG. 3a and FIG. 4, and/or in relation to FIG. 5a and FIG. 6. Further, the data processing may be done consistent with an approach discussed below in relation to FIGS. 7a-7c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
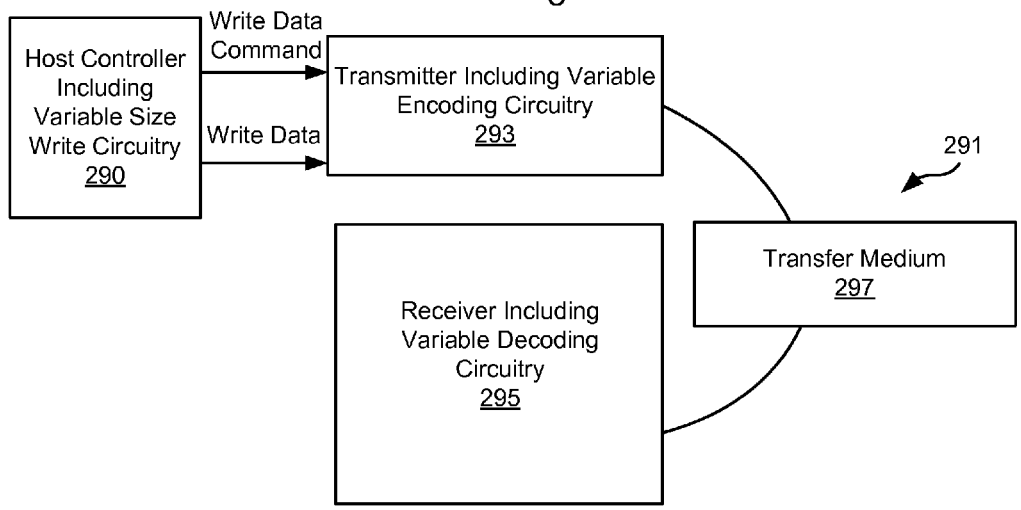
FIG. 2 depicts a data transmission system including variable size encoding/decoding circuitry in accordance with one or more embodiments of the present invention.

Turning to FIG. 2, a data transmission system 291 including a receiver 295 having variable size encoding/decoding circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295.

Data transmission system 291 is accessed based upon instructions received from a host controller 290. Host controller 290 includes variable size write circuitry operable to provide data sets of one or more lengths along with a write command where the write data set(s) are to be transmitted by transmitter 293. Transmitter 293 applies variable rate encoding to the received write data, and transfers a resulting encoded data set via transfer medium 297 to receiver 295. The variable encoding applied by transmitter 293 may be implemented similar to that discussed below in relation to FIG. 3a or FIG. 5a. Receiver 295 processes a received input to yield the originally transmitted data. As part of processing the received information, receiver 295 utilizes variable decoding circuitry to process the received data. The variable decoding circuitry may be implemented similar to that discussed below in relation to FIG. 4 or FIG. 6. The data encoding and decoding may be done using an approach similar to that discussed below in relation to FIGS. 7a-7c.

Figure 3A:
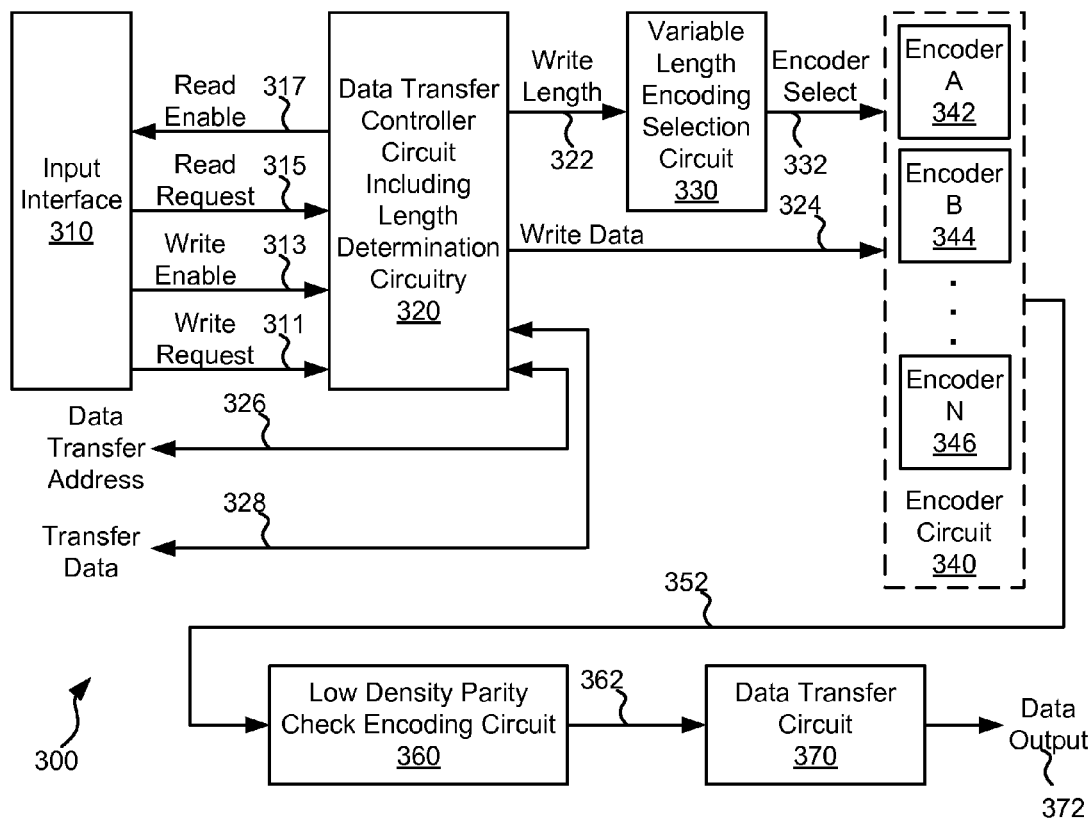
FIG. 3a shows a data encoding circuit operable to apply variable length encoding in accordance with some embodiments of the present invention.

FIG. 3a shows a data encoding circuit 300 operable to apply variable length encoding in accordance with some embodiments of the present invention. Data encoding circuit 300 includes an input interface 310 that is operable to receive and provide control commands and information to/from a host controller (not shown). The control commands and information include, but are not limited to, a read enable 317, a write enable 313, a read request 315, a write request 311, a data transfer address 326 and transfer data 328. When read request 315 is asserted indicating an imminent data read, a read address is provided via data transfer address 326, a read data is provided via transfer data 328, and read enable 317 frames the read data. The read request is provided from a data transfer controller circuit 320 that causes the requested data to be accessed, decoded and provided as read data via transfer data 328. The processing of the read data is done using the circuit described below in relation to FIG. 4.

When write request 311 is asserted indicating an imminent data write, a write address is provided via data transfer address 326, a write data is provided via transfer data 328, and write enable 313 frames the write data. Data transfer controller circuit 320 monitors input data received as transfer data 328 as framed by assertion of write enable 313. In particular, data transfer controller circuit 320 counts the length of the received write data. The length of the write data is provided as a write length 322 to a variable length encoding selection circuit 330. Based upon the length, variable length encoding selection circuit 330 selects an encoder (i.e., one of an encoder A 342, an encoder B 344, and an encoder N 346) included as part of encoder circuit 340 to apply a first level of encoding to write data 324 that was received via transfer data 328. It should be noted that while encoder circuit 340 is shown with three encoders (encoder A 342, encoder B 344, and encoder N 346), any number of encoders may be included in encoder circuit 340 in accordance with different embodiments of the present invention. In one particular embodiment of the present invention, encoder circuit 340 includes sixteen encoders.

The first level encoding may be any type of encoding where the use of additional encoding information improves the ability to recover the encoded output. For example, the encoding may be run length limited encoding as is known in the art. Such run length encoding may allow for a first number of consecutive bits (i.e., a run) or symbols that may be repeated. Where the first level encoding is run length limited encoding, encoder A 342 may allow for a first number of consecutive bits or symbols to repeat, encoder B 344 may allow for a second number of consecutive bits or symbols to repeat, and encoder N 346 may allow for a third number of consecutive bits or symbols to repeat. Allowing a different number of consecutive bits to be repeated results in a change in the length of first level encoder added information with the smaller runs resulting in a larger length of first level encoder added information when compared with larger runs. Alternatively or in addition, the first level encoding may apply more redundant bits that may be used for error checking and/or correction for a given codeword. As yet another example, first level encoding may apply a variable length low density parity check encoding. Based upon the disclosure provided herein, one of ordinary skill in the art will recognize a variety of encoding algorithms that may apply encryption, modulation and/or error correction encoding that may be applied as the first level encoding in accordance with different embodiments of the present invention.

In turn, encoder circuit 340 uses the selected encoder to encode the received write data 324 to yield first level encoder added information in addition to write data 324. The combination of write data 324, encoder select 332, and first level encoder added information is provided as a first level encoded output 352 to a low density parity check encoding circuit 360.

The selected encoder is the encoder included in encoder circuit 340 that provides a length of first level encoder added information that can fit within an unused length of first level encoded output 352, and makes the best use of the unused length. As an example, where encoder A 342 generates a first level encoder added information of size A, encoder B 344 generates a first level encoder added information of size B, encoder N 346 generates a first level encoder added information of size N, the received write data 324 is of size X, the defined size of first level encoded output 352 is a size Z, then the encoder within encoder circuit 340 is selected in accordance with the following pseudocode that assumes size N is greater than size B, and size B is greater than size A:

```
If ([size Z – size X] > size N){
    Select Encoder N 346;
}
Else if ([size Z – size X] > size B){
    Select Encoder B 344;
}
Else {
    Select Encoder A 342
}
```

Again, it should be noted that while the embodiment is described as relying on three encoders (encoder A 342, encoder B 344, and encoder N 346), any number of encoders may be included in encoder circuit 340 in accordance with different embodiments of the present invention.

First level encoded output 352 is encoded using low density parity check encoder circuit 360 that yields a codeword 362 to a data transfer circuit 370. Low density parity check encoder circuit 360 generates low density parity check added information that is added to first level encoded output 352. Low density parity check encoder circuit 360 may be any low density parity check encoder circuit known in the art. Further, data transfer circuit 370 may be any circuit known in the art capable of transferring a codeword. In one particular embodiment of the present invention, data transfer circuit 370 is a data write circuit operable to prepare and write data to a storage medium. In another particular embodiment of the present invention, data transfer circuit 370 is a data transmit circuit operable to prepare and transmit data to a recipient device. Based upon the disclosure provided herein, one of ordinary skill in the art will recognize a variety of data transfer circuits that may be used in relation to different embodiments of the present invention. Data transfer circuit 370 provides a data output 372.

Figure 3B:
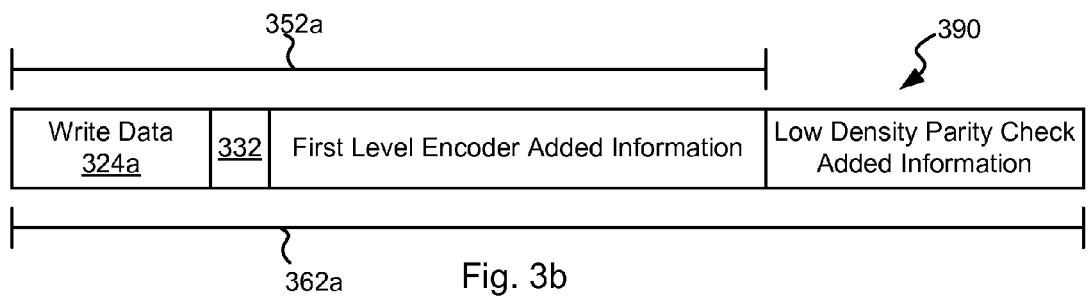

FIG. 3b shows an example 390 of a variably encoded codeword 362a that may be generated using the data encoding circuit of FIG. 3a. In particular, variably encoded codeword 362a includes a combination of first level encoded output 352a and the low density parity check added information. While first level encoded output 352a and the low density parity check added information are shown as completely distinct, they may be intermixed and/or include one or more bits of first level encoded output 352a that are changed as part of the low density parity check encoding process. As shown, first level encoded output 352a includes write data 324a, encoder select 332 and the first level encoder added information. Of note, the first level encoder added information is derived from an encoder that provides an output that most effectively uses the area identified as the first level encoder added information. Further, it should be noted that while write data 324a, encoder select 332, and the first level encoder added information are shown as completely distinct, they may be intermixed and/or include one or more bits of write data 324a that are changed as part of the first level encoding.

Figure 3C:
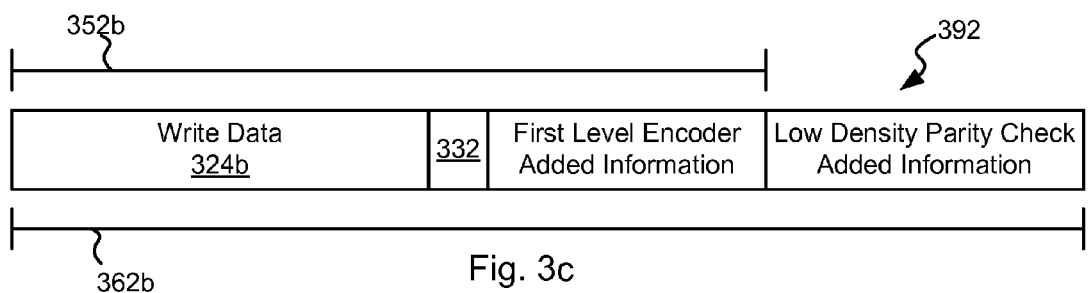

FIG. 3c shows another example 392 of a variably encoded codeword 362b that may be generated using the data encoding circuit of FIG. 3a. In particular, variably encoded codeword 362b includes a combination of first level encoded output 352b and the low density parity check added information. While first level encoded output 352b and the low density parity check added information are shown as completely distinct, they may be intermixed and/or include one or more bits of first level encoded output 352b that are changed as part of the low density parity check encoding process. As shown, first level encoded output 352b includes write data 324b, encoder select 332 and the first level encoder added information. Of note, the first level encoder added information is derived from an encoder that provides an output that most effectively uses the area identified as the first level encoder added information. Further, it should be noted that while write data 324b, encoder select 332, and the first level encoder added information are shown as completely distinct, they may be intermixed and/or include one or more bits of write data 324b that are changed as part of the first level encoding.

Of note, as shown in FIGS. 3b-3c, variable encoded codewords 362a, 362b are the same length. This length may be, for example, the sector size of a storage device or the transfer block size of a communication device. Due to this fixed size, the shorter the amount of data provided as write data 324a, 324b, the more area that remains for first level added information which increases the resiliency of the data set to errors.

Figure 4:
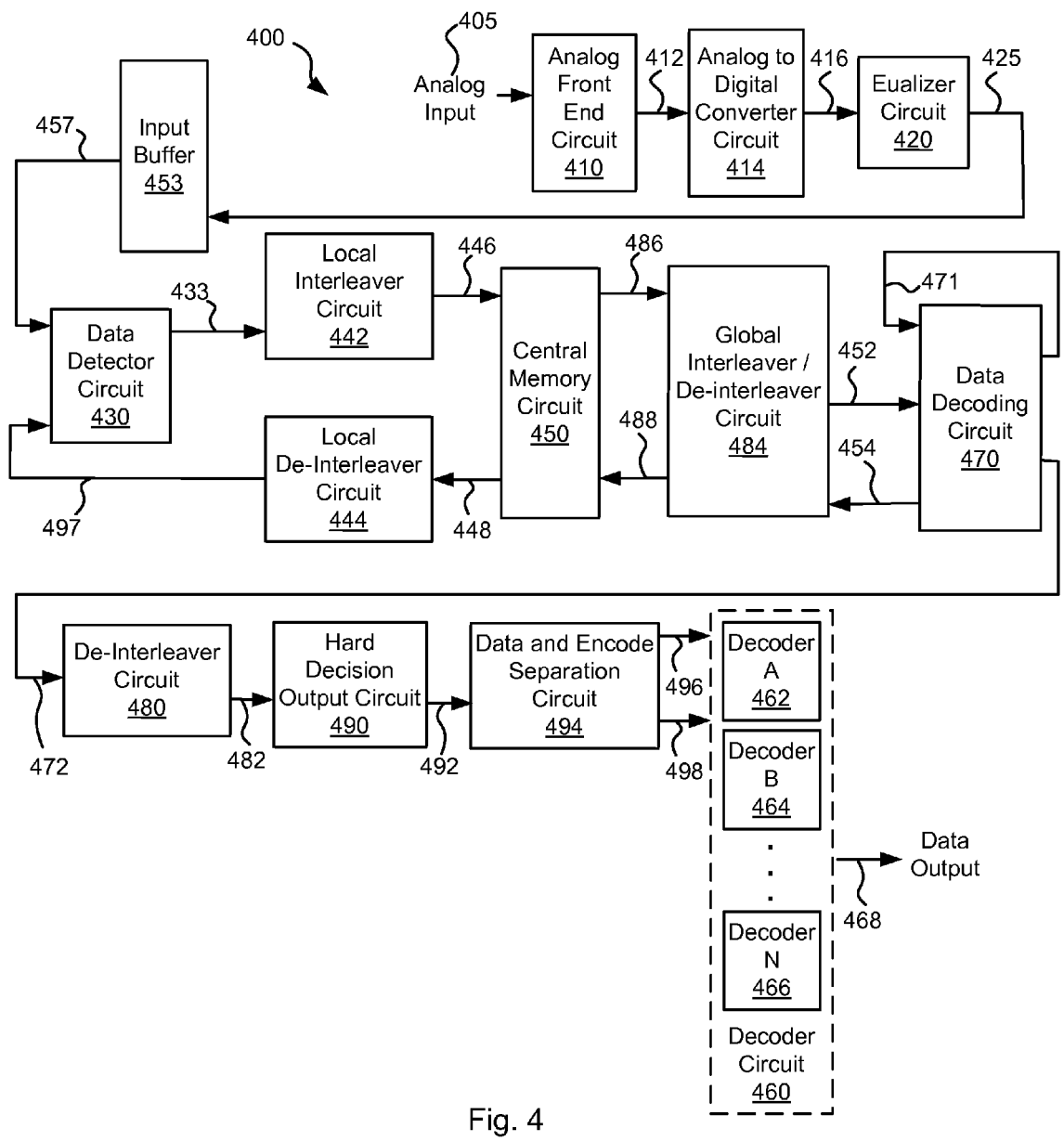
FIG. 4 shows a data decoding circuit operable to apply variable length decoding in accordance with some embodiments of the present invention.

Turning to FIG. 4, a data decoding circuit 400 operable to apply variable length decoding is shown in accordance with some embodiments of the present invention. Data decoding circuit 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 corresponds to codeword 362 of FIG. 3a.

Equalized output 425 is stored to an input buffer 453 that includes sufficient memory to maintain one or more codewords until processing of that codeword is completed through a data detector circuit 430 and a data decoding circuit 470 including, where warranted, multiple global iterations (passes through both data detector circuit 430 and data decoding circuit 470) and/or local iterations (passes through data decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once data decoding circuit 470 is available, a previously stored interleaved codeword 446 is accessed from central memory circuit 450 as a stored codeword 486 and globally interleaved by a global interleaver/de-interleaver circuit 484. Global interleaver/De-interleaver circuit 484 may be any circuit known in the art that is capable of globally rearranging codewords. Global interleaver/De-interleaver circuit 484 provides a decoder input 452 into data decoding circuit 470. Data decoding circuit 370 applies a data decode algorithm to decoder input 352 to yield a decoded output 371. The data decode algorithm is a low density parity check algorithm designed to reverse the encoding applied by low density parity check encoding circuit 360 of FIG. 3a. In cases where another local iteration (i.e., another pass trough data decoder circuit 470) is desired, data decoding circuit 470 re-applies the data decode algorithm to decoder input 452 guided by decoded output 471. This continues until either a maximum number of local iterations is exceeded or decoded output 471 converges.

Where decoded output 471 fails to converge (i.e., fails to yield the originally written data set) and a number of local iterations through data decoder circuit 470 exceeds a threshold, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set), the resulting decoded output is provided as an output codeword 472 to a de-interleaver circuit 480. De-interleaver circuit 480 rearranges the data to reverse both the global and local interleaving applied to the data to yield a de-interleaved output 482. De-interleaved output 482 is provided to a hard decision output circuit 490. Hard decision output circuit 490 is operable to re-order data sets that may complete out of order back into their original order. The originally ordered data sets are then provided as a first level encoded output 492. First level encoded output 492 corresponds to first level encoded output 352 of FIG. 3a.

First level encoded output 492 is provided to a data and encode separation circuit 494 that extracts an encoder select 496 from first level encoded output 492 and an encoded data set 498. Encoded select 496 corresponds to encoded select 332 of FIG. 3a. Encoded data set 498 is a combination of the original write data (write data 324 of FIG. 3a) and the first level encoder added information of FIG. 3a. Encoder select 496 selects one of a number of decoders (e.g., a decoder A 462, decoder B 464, and decoder N 466) included in a decoder circuit 460. The selected decoder reverses the encoding originally applied by encoder circuit 360. The resulting decoded output is provided as a data output 468 that corresponds to write data 324 of FIG. 3a. Data output 468 is provided as transfer data 328 to a host via data transfer controller circuit 320 of FIG. 3a.

Figure 5A:
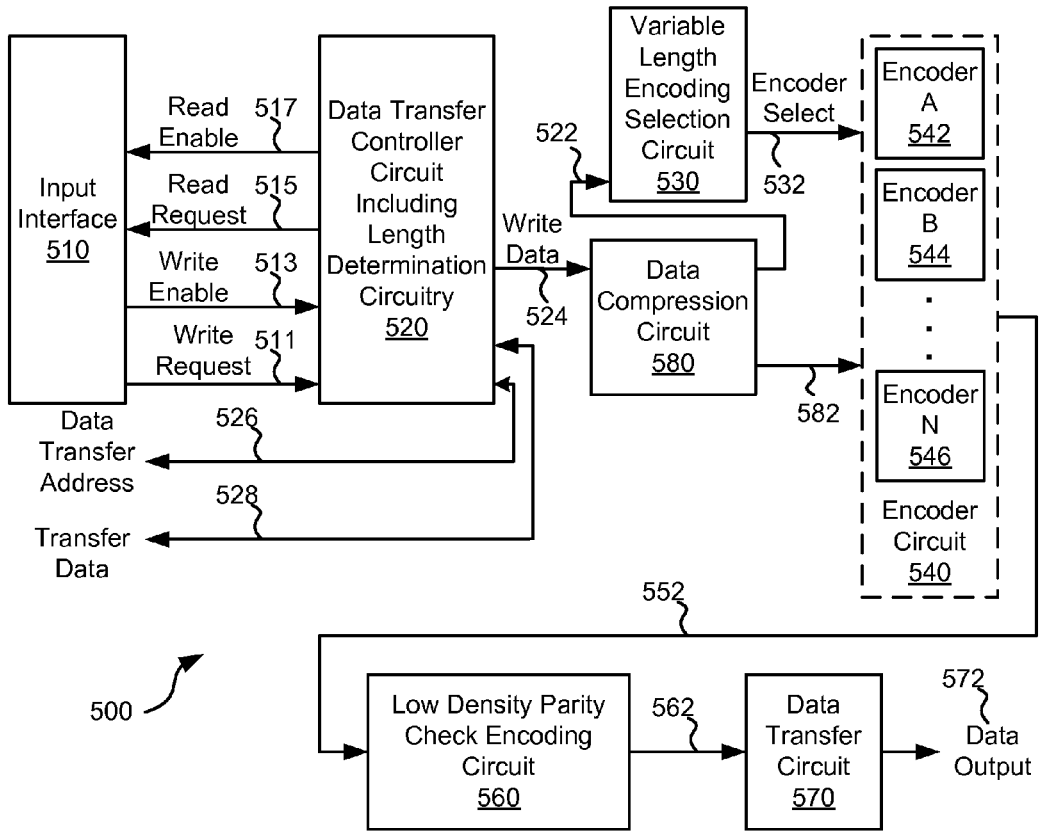
FIG. 5a shows another data encoding circuit operable to apply variable length encoding in accordance with some embodiments of the present invention.

FIG. 5a shows another data encoding circuit 500 operable to apply variable length encoding in accordance with some embodiments of the present invention. Data encoding circuit 500 includes an input interface 510 that is operable to receive and provide control commands and information to/from a host controller (not shown). The control commands and information include, but are not limited to, a read enable 517, a write enable 513, a read request 515, a write request 511, a data transfer address 526 and transfer data 528. When read request 515 is asserted indicating an imminent data read, a read address is provided via data transfer address 526, a read data is provided via transfer data 528, and read enable 517 frames the read data. The read request is provided from a data transfer controller circuit 520 that causes the requested data to be accessed, decoded and provided as read data via transfer data 528. The processing of the read data is done using the circuit described below in relation to FIG. 6.

When write request 511 is asserted indicating an imminent data write, a write address is provided via data transfer address 526, a write data is provided via transfer data 528, and write enable 513 frames the write data. Data transfer controller circuit 520 provides data received via transfer data 528 as framed by write enable 513 as write data to a data compression circuit 580 that applies a compression algorithm to yield a compressed data 582. In addition, data compression circuit 580 provides a write length 522 to a variable length encoding selection circuit 530. Write length 522 indicates the length of compressed data 582. Data compression circuit 580 may utilize any data compression algorithm known in the art.

In some embodiments of the present invention, data compression circuit 580 is selectably operable. In such cases, data compression circuit 580 determines whether application of compression will result in a substantial decrease in the size of the transferred data set. Where no substantial decrease is possible, compression is not applied and compressed data 582 is the same as write data 524 plus an additional compression bit indicating that no compression was applied. In contrast, where a substantial decrease is possible, compression is applied and compressed data 582 is a compressed version of write data 524 plus an additional compression bit indicating that compression was applied. The bit indicating whether compression was applied is used later to determine whether decompression is to be applied or not during the decoding process described below in relation to FIG. 6.

Based upon the length, variable length encoding selection circuit 530 selects an encoder (i.e., one of an encoder A 542, an encoder B 544, and an encoder N 546) included as part of encoder circuit 540 to apply a first level of encoding to compressed data 582. It should be noted that while encoder circuit 540 is shown with three encoders (encoder A 542, encoder B 544, and encoder N 546), any number of encoders may be included in encoder circuit 540 in accordance with different embodiments of the present invention. In one particular embodiment of the present invention, encoder circuit 540 includes sixteen encoders.

The first level encoding may be any type of encoding where the use of additional encoding information improves the ability to recover the encoded output. For example, the encoding may be run length limited encoding as is known in the art. Such run length encoding may allow for a first number of consecutive bits (i.e., a run) or symbols that may be repeated. Where the first level encoding is run length limited encoding, encoder A 542 may allow for a first number of consecutive bits or symbols to repeat, encoder B 544 may allow for a second number of consecutive bits or symbols to repeat, and encoder N 546 may allow for a third number of consecutive bits or symbols to repeat. Allowing a different number of consecutive bits to be repeated results in a change in the length of first level encoder added information with the smaller runs resulting in a larger length of first level encoder added information when compared with larger runs. Alternatively or in addition, the first level encoding may apply more redundant bits that may be used for error checking and/or correction for a given codeword. As yet another example, first level encoding may apply a variable length low density parity check encoding. Based upon the disclosure provided herein, one of ordinary skill in the art will recognize a variety of encoding algorithms that may apply encryption, modulation and/or error correction encoding that may be applied as the first level encoding in accordance with different embodiments of the present invention.

In turn, encoder circuit 540 uses the selected encoder to encode the received compressed data 582 to yield first level encoder added information in addition to compressed data 582. The combination of compressed data 582, encoder select 532, and the first level encoder added information is provided as a first level encoded output 552 to a low density parity check encoding circuit 560.

The selected encoder is the encoder included in encoder circuit 540 that provides a length of first level encoder added information that can fit within an unused length of first level encoded output 552, and makes the best use of the unused length. As an example, where encoder A 542 generates a first level encoder added information of size A, encoder B 544 generates a first level encoder added information of size B, encoder N 546 generates a first level encoder added information of size N, the received write data 524 is of size X, the defined size of first level encoded output 552 is a size Z, then the encoder within encoder circuit 540 is selected in accordance with the following pseudocode that assumes size N is greater than size B, and size B is greater than size A:

```
If ([size Z − size X] > size N){
    Select Encoder N 546;
}
Else if ([size Z − size X] > size B){
    Select Encoder B 544;
}
Else {
    Select Encoder A 542
}
```

Again, it should be noted that while the embodiment is described as relying on three encoders (encoder A 542, encoder B 544, and encoder N 546), any number of encoders may be included in encoder circuit 540 in accordance with different embodiments of the present invention.

First level encoded output 552 is encoded using low density parity check encoder circuit 560 that yields a codeword 562 to a data transfer circuit 570. Low density parity check encoder circuit 560 generates low density parity check added information that is added to first level encoded output 552. Low density parity check encoder circuit 560 may be any low density parity check encoder circuit known in the art. Further, data transfer circuit 570 may be any circuit known in the art capable of transferring a codeword. In one particular embodiment of the present invention, data transfer circuit 570 is a data write circuit operable to prepare and write data to a storage medium. In another particular embodiment of the present invention, data transfer circuit 570 is a data transmit circuit operable to prepare and transmit data to a recipient device. Based upon the disclosure provided herein, one of ordinary skill in the art will recognize a variety of data transfer circuits that may be used in relation to different embodiments of the present invention. Data transfer circuit 570 provides a data output 572.

Figure 5B:
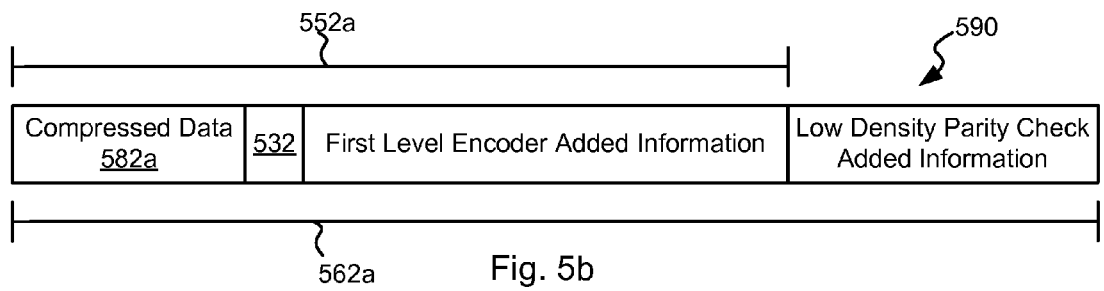

FIG. 5b shows an example 590 of a variably encoded codeword 562a that may be generated using the data encoding circuit of FIG. 5a. In particular, variably encoded codeword 562a includes a combination of first level encoded output 552a and the low density parity check added information. While first level encoded output 552a and the low density parity check added information are shown as completely distinct, they may be intermixed and/or include one or more bits of first level encoded output 552a that are changed as part of the low density parity check encoding process. As shown, first level encoded output 552a includes compressed data 582a, encoder select 532 and the first level encoder added information. Of note, the first level encoder added information is derived from an encoder that provides an output that most effectively uses the area identified as the first level encoder added information. Further, it should be noted that while compressed data 582a, encoder select 532, and the first level encoder added information are shown as completely distinct, they may be intermixed and/or include one or more bits of compressed data 582a that are changed as part of the first level encoding.

Figure 5C:
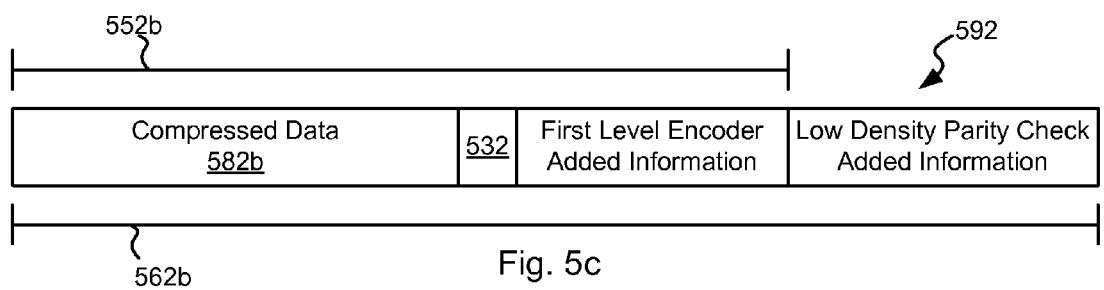

FIG. 5c shows another example 592 of a variably encoded codeword 562b that may be generated using the data encoding circuit of FIG. 5a. In particular, variably encoded codeword 562b includes a combination of first level encoded output 552b and the low density parity check added information. While first level encoded output 552b and the low density parity check added information are shown as completely distinct, they may be intermixed and/or include one or more bits of first level encoded output 552b that are changed as part of the low density parity check encoding process. As shown, first level encoded output 552b includes write data 524b, encoder select 532 and the first level encoder added information. Of note, the first level encoder added information is derived from an encoder that provides an output that most effectively uses the area identified as the first level encoder added information. Further, it should be noted that while compressed data 582b, encoder select 532, and the first level encoder added information are shown as completely distinct, they may be intermixed and/or include one or more bits of compressed data 582b that are changed as part of the first level encoding.

Of note, as shown in FIGS. 5b-5c, variable encoded codewords 362a, 362b are the same length. This length may be, for example, the sector size of a storage device or the transfer block size of a communication device. Due to this fixed size, the shorter the amount of data provided as compressed data 582a, 582b, the more area that remains for first level added information which increases the resiliency of the data set to errors.

Figure 6:
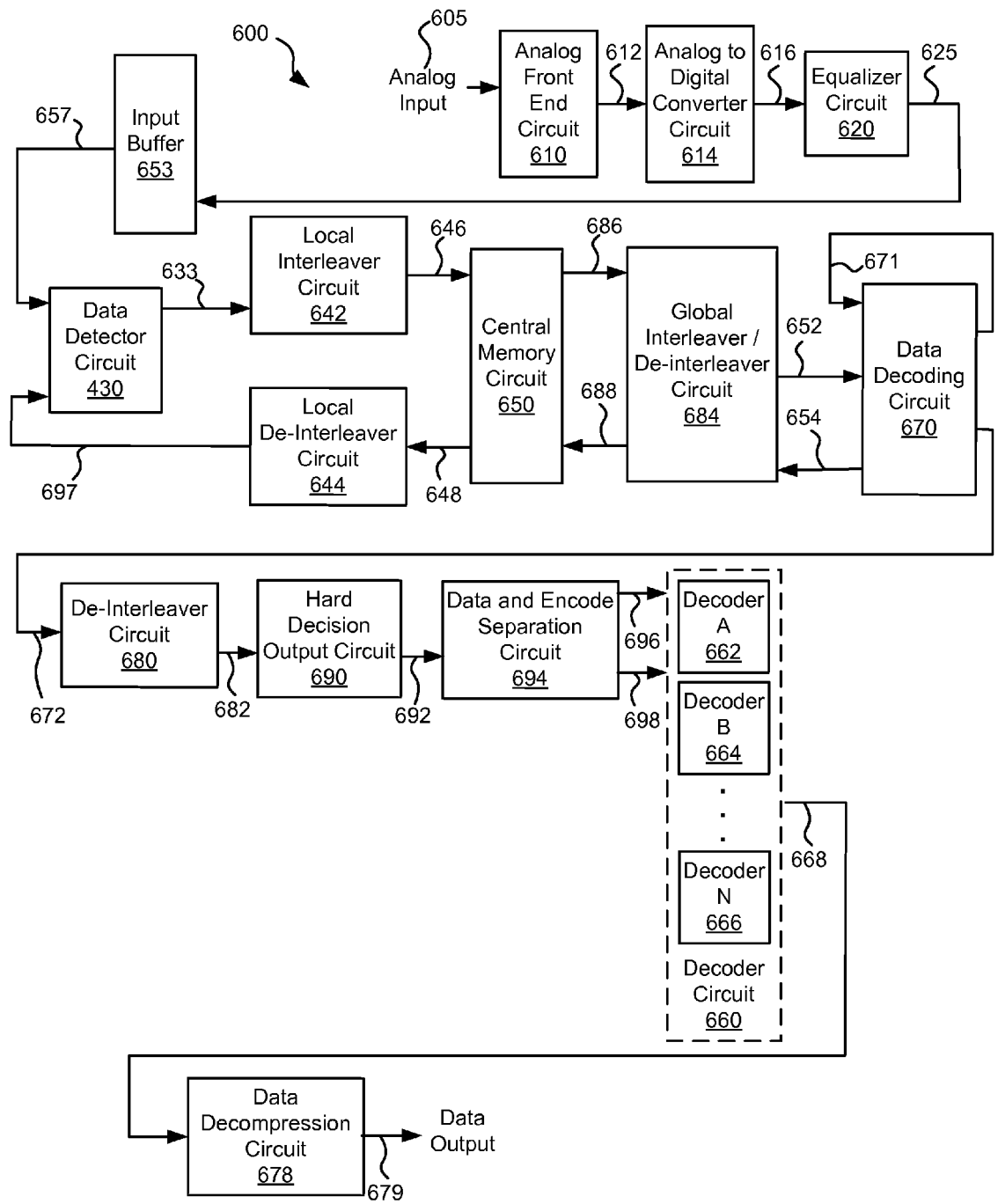
FIG. 6 shows another data decoding circuit operable to apply variable length decoding in accordance with some embodiments of the present invention.

Turning to FIG. 6, a data decoding circuit 600 operable to apply variable length decoding is shown in accordance with some embodiments of the present invention. Data decoding circuit 600 includes an analog front end circuit 610 that receives an analog signal 605. Analog front end circuit 610 processes analog signal 605 and provides a processed analog signal 612 to an analog to digital converter circuit 614. Analog front end circuit 610 may include, but is not limited to, an analog filter and an amplifier circuit as are known in the art. Based upon the disclosure provided herein, one of ordinary skill in the art will recognize a variety of circuitry that may be included as part of analog front end circuit 610. In some cases, analog signal 605 is derived from a read/write head assembly (not shown) that is disposed in relation to a storage medium (not shown). In other cases, analog signal 605 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 605 may be derived.

Analog to digital converter circuit 614 converts processed analog signal 612 into a corresponding series of digital samples 616. Analog to digital converter circuit 614 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 616 are provided to an equalizer circuit 620. Equalizer circuit 620 applies an equalization algorithm to digital samples 616 to yield an equalized output 625. In some embodiments of the present invention, equalizer circuit 620 is a digital finite impulse response filter circuit as are known in the art. It may be possible that equalized output 625 may be received directly from a storage device in, for example, a solid state storage system. In such cases, analog front end circuit 610, analog to digital converter circuit 614 and equalizer circuit 620 may be eliminated where the data is received as a digital data input. Equalized output 625 corresponds to codeword 562 of FIG. 5a.

Equalized output 625 is stored to an input buffer 653 that includes sufficient memory to maintain one or more codewords until processing of that codeword is completed through a data detector circuit 630 and a data decoding circuit 670 including, where warranted, multiple global iterations (passes through both data detector circuit 630 and data decoding circuit 670) and/or local iterations (passes through data decoding circuit 670 during a given global iteration). An output 657 is provided to data detector circuit 630.

Data detector circuit 630 may be a single data detector circuit or may be two or more data detector circuits operating in parallel on different codewords. Whether it is a single data detector circuit or a number of data detector circuits operating in parallel, data detector circuit 630 is operable to apply a data detection algorithm to a received codeword or data set. In some embodiments of the present invention, data detector circuit 630 is a Viterbi algorithm data detector circuit as are known in the art. In other embodiments of the present invention, data detector circuit 630 is a maximum a posteriori data detector circuit as are known in the art. Based upon the disclosure provided herein, one of ordinary skill in the art will recognize a variety of data detector circuits that may be used in relation to different embodiments of the present invention. In some cases, one data detector circuit included in data detector circuit 630 is used to apply the data detection algorithm to the received codeword for a first global iteration applied to the received codeword, and another data detector circuit included in data detector circuit 630 is operable apply the data detection algorithm to the received codeword guided by a decoded output accessed from a central memory circuit 650 on subsequent global iterations.

Upon completion of application of the data detection algorithm to the received codeword on the first global iteration, data detector circuit 630 provides a detector output 633. Detector output 633 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 633 is provided to a local interleaver circuit 642. Local interleaver circuit 642 is operable to shuffle sub-portions (i.e., local chunks) of the data set included as detected output and provides an interleaved codeword 646 that is stored to central memory circuit 650. Interleaver circuit 642 may be any circuit known in the art that is capable of shuffling data sets to yield a re-arranged data set. Interleaved codeword 646 is stored to central memory circuit 650.

Once data decoding circuit 670 is available, a previously stored interleaved codeword 646 is accessed from central memory circuit 650 as a stored codeword 686 and globally interleaved by a global interleaver/de-interleaver circuit 684. Global interleaver/De-interleaver circuit 684 may be any circuit known in the art that is capable of globally rearranging codewords. Global interleaver/De-interleaver circuit 684 provides a decoder input 652 into data decoding circuit 670. Data decoding circuit 570 applies a data decode algorithm to decoder input 552 to yield a decoded output 571. The data decode algorithm is a low density parity check algorithm designed to reverse the encoding applied by low density parity check encoding circuit 560 of FIG. 5a. In cases where another local iteration (i.e., another pass trough data decoder circuit 670) is desired, data decoding circuit 670 re-applies the data decode algorithm to decoder input 652 guided by decoded output 671. This continues until either a maximum number of local iterations is exceeded or decoded output 671 converges.

Where decoded output 671 fails to converge (i.e., fails to yield the originally written data set) and a number of local iterations through data decoder circuit 670 exceeds a threshold, the resulting decoded output is provided as a decoded output 654 back to central memory circuit 650 where it is stored awaiting another global iteration through a data detector circuit included in data detector circuit 630. Prior to storage of decoded output 654 to central memory circuit 650, decoded output 654 is globally de-interleaved to yield a globally de-interleaved output 688 that is stored to central memory circuit 650. The global de-interleaving reverses the global interleaving earlier applied to stored codeword 686 to yield decoder input 652. When a data detector circuit included in data detector circuit 630 becomes available, a previously stored de-interleaved output 688 accessed from central memory circuit 650 and locally de-interleaved by a de-interleaver circuit 644. De-interleaver circuit 644 re-arranges decoder output 648 to reverse the shuffling originally performed by interleaver circuit 642. A resulting de-interleaved output 697 is provided to data detector circuit 630 where it is used to guide subsequent detection of a corresponding data set previously received as equalized output 625.

Alternatively, where the decoded output converges (i.e., yields the originally written data set), the resulting decoded output is provided as an output codeword 672 to a de-interleaver circuit 680. De-interleaver circuit 680 rearranges the data to reverse both the global and local interleaving applied to the data to yield a de-interleaved output 682. De-interleaved output 682 is provided to a hard decision output circuit 690. Hard decision output circuit 690 is operable to re-order data sets that may complete out of order back into their original order. The originally ordered data sets are then provided as a first level encoded output 692. First level encoded output 692 corresponds to first level encoded output 552 of FIG. 5a.

First level encoded output 692 is provided to a data and encode separation circuit 694 that extracts an encoder select 696 from first level encoded output 692 and an encoded data set 698. Encoded select 696 corresponds to encoded select 532 of FIG. 5*a*. Encoded data set 698 is a combination of the original write data (write data 524 of FIG. 5*a*) and the first level encoder added information of FIG. 5*a*. Encoder select 696 selects one of a number of decoders (e.g., a decoder A 662, decoder B 664, and decoder N 666) included in a decoder circuit 660. The selected decoder reverses the encoding originally applied by encoder circuit 560. The resulting decoded output is provided as a decoded output 668 that corresponds to compressed data 582 of FIG. 5*a*. Decoded output 668 is provided to a data decompression circuit 678 that reverses the data compression applied by data compression circuit 580 to yield a data output 679. Data output 679 is provided as transfer data 528 to a host via data transfer controller circuit 520 of FIG. 5*a*. Again, as discussed above in relation to FIG. 5*a*, in some embodiments of the present invention, compression may be selectable and indicated by a compression indicated bit included in the transferred data. Where the data is not compressed, data compression circuit 678 simply provides decoded output 668 as data output 679.

Figure 7A:
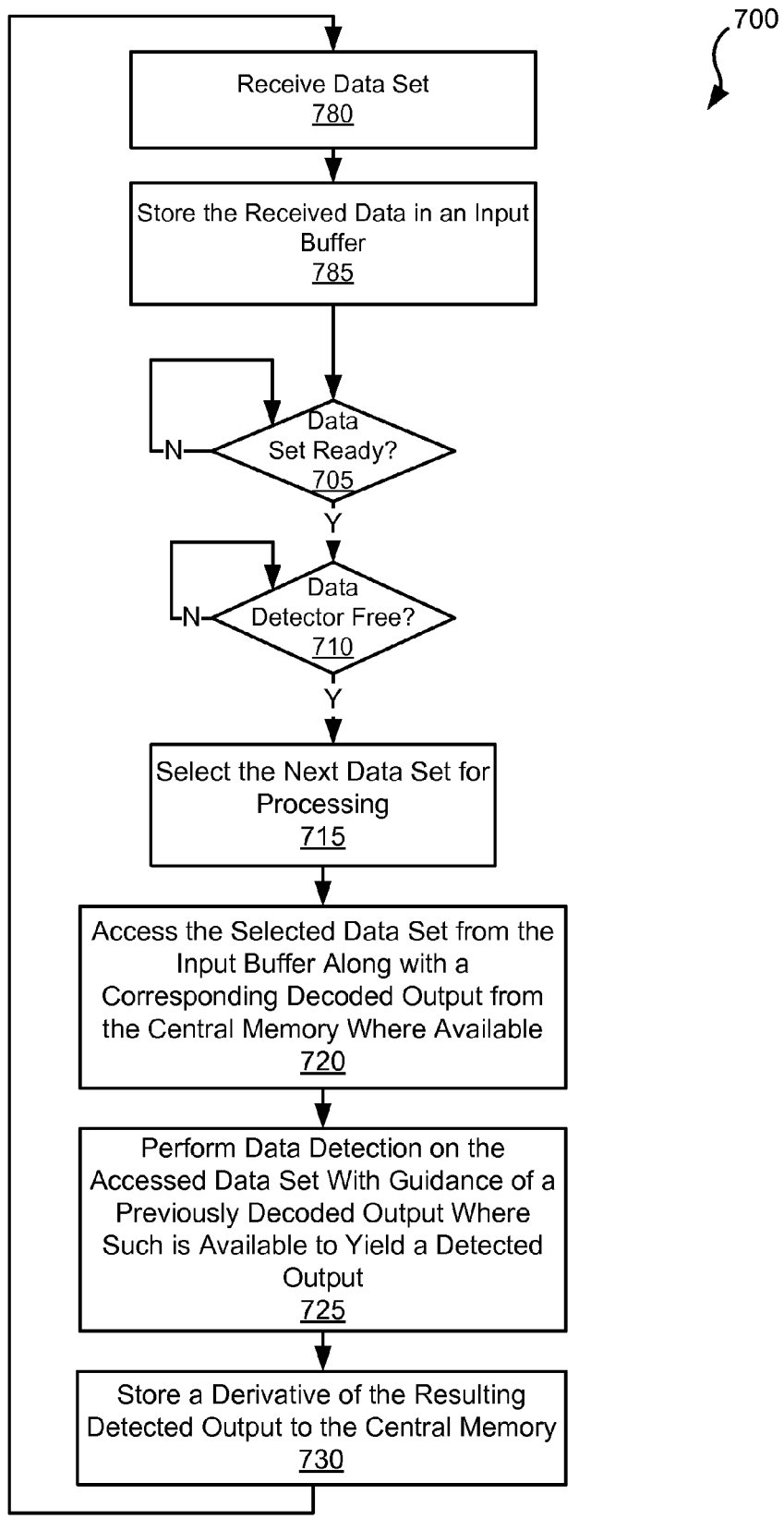
FIGS. 7a-7c are flow diagrams showing a method for data processing utilizing variable length encoding/decoding in accordance with some embodiments of the present invention.
Figure 7B:
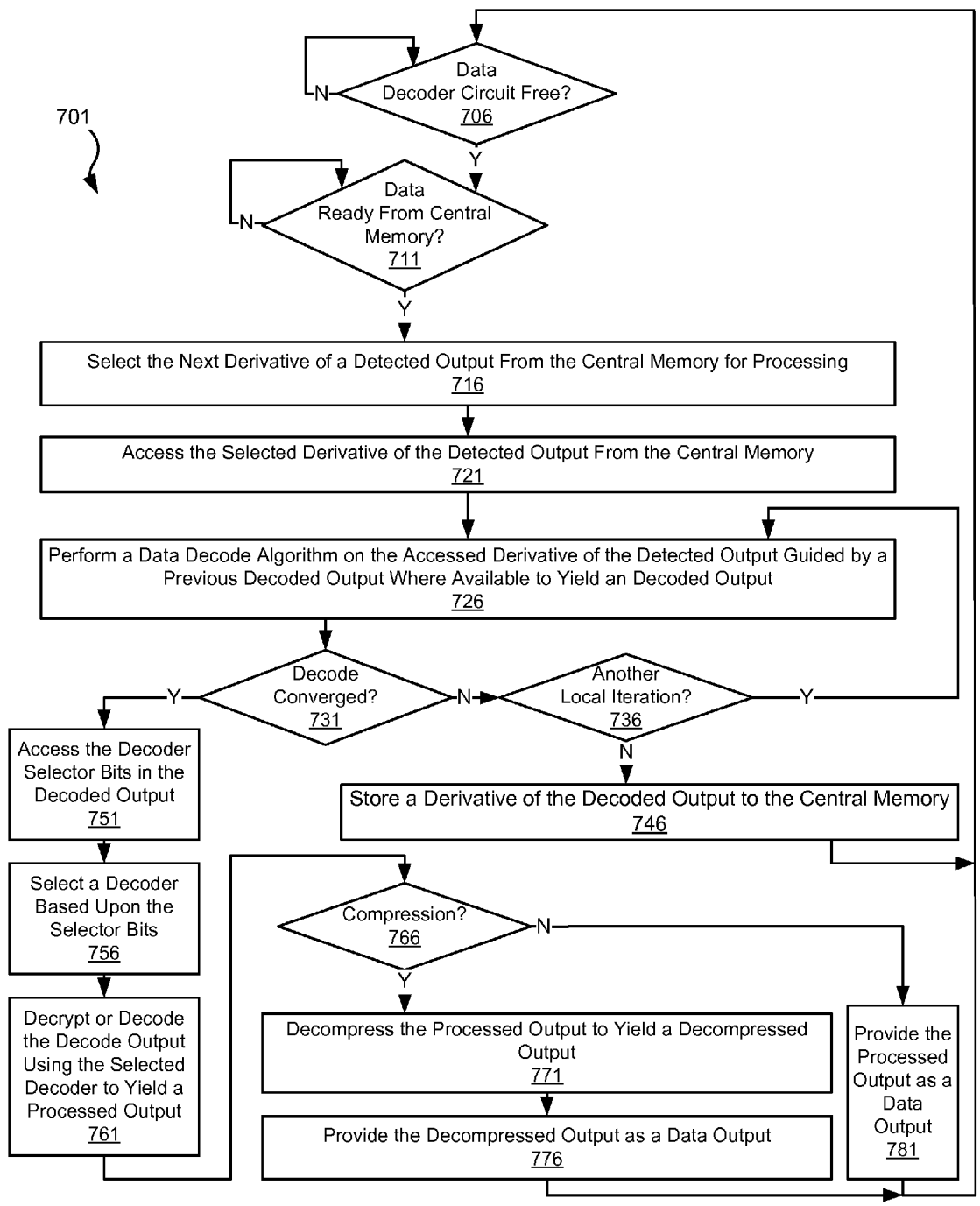
Figure 7C:
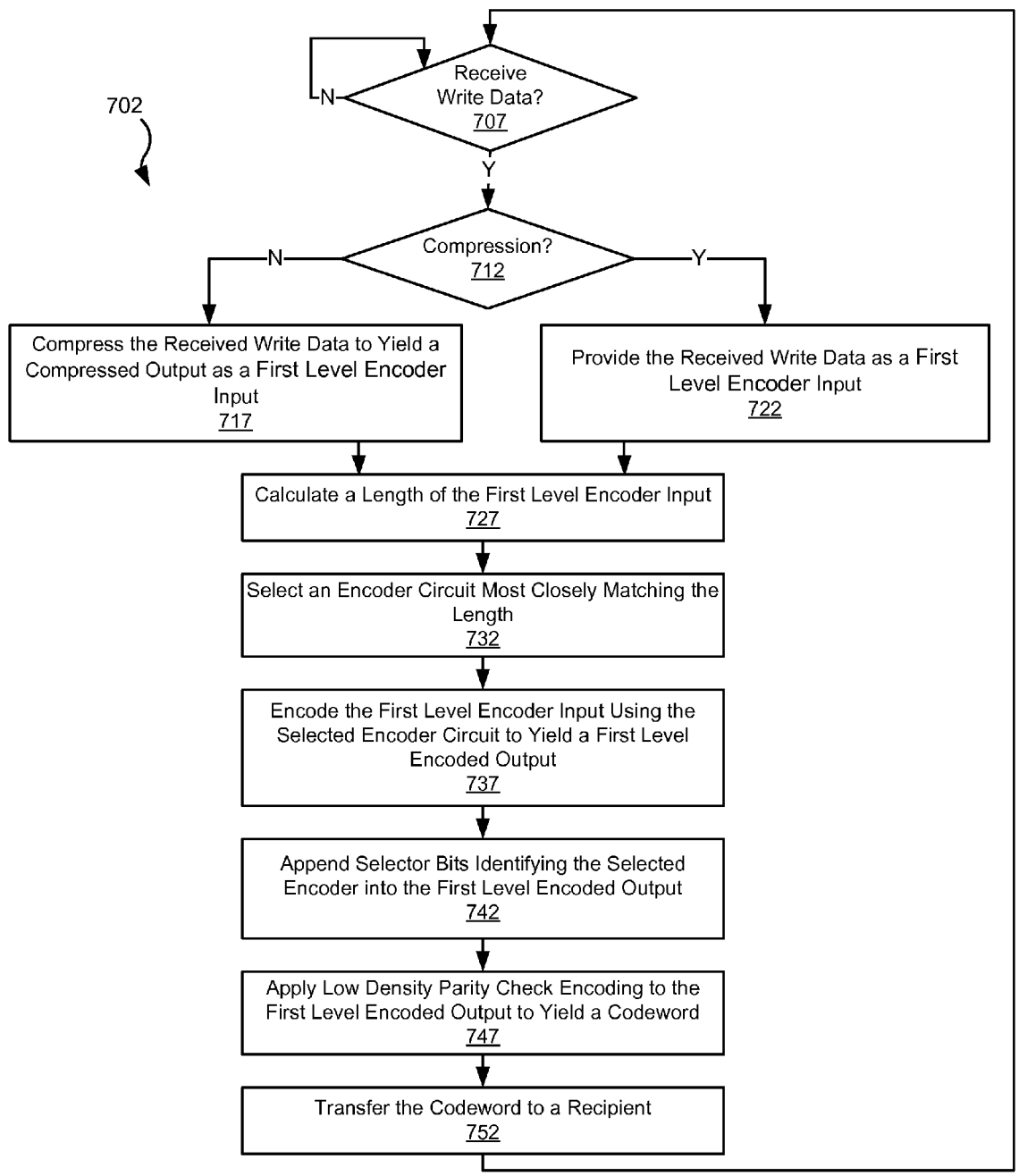

Turning to FIGS. 7*a*-7*c*, flow diagrams 700, 701, 702 show a method for data processing utilizing variable length encoding/decoding in accordance with some embodiments of the present invention. Following flow diagram 700 of FIG. 7*a*, a data set is received (block 780) and stored in an input buffer (block 785). This received data set may be derived from, for example, a storage medium, or a communication medium via a transmitter. Based upon the disclosure provided herein, one of ordinary skill in the art will recognize a variety of sources of the received data. It is determined whether a data set is ready in the input buffer (block 705). A data set may be considered ready when an entire codeword is available in the input buffer, or when a sufficient part of a codeword is in the input buffer such that a data detection algorithm can run continuously to the end of the codeword as it becomes available in the input buffer. Where a data set is ready (block 705), it is determined whether a data detector circuit is available to process the data set (block 710). The data detector circuit may be, for example, a Viterbi algorithm data detector circuit or a maximum a posteriori data detector circuit as are known in the art Where the data detector circuit is available for processing (block 710), the next data set in the input buffer is selected for processing (block 715). The selection of the next data set may be done in accordance with any scheduling or priority scheme known in the art. The selected data set is accessed from the input buffer (block 720). Where this is the second or later global iteration for the selected data set, a corresponding decoded output is also accessed from the central memory. A data detection algorithm is then applied to the accessed data set to yield a detected output (block 725). Where it is a second or later global iteration for the accessed data set, the corresponding decoded output is used to guide application of the data detection algorithm. The data detection algorithm may be, but is not limited to, a maximum a posteriori data detection algorithm or a Viterbi data detection algorithm. Based upon the disclosure provided herein, one of ordinary skill in the art will recognize a variety of data detection algorithms that may be used in relation to different embodiments of the present invention. A derivative of the detected output is stored to the central memory (block 730). The derivative of the detected output may be, for example, an interleaved or shuffled version of the detected output.

Following flow diagram 701 of FIG. 7*b*, it is determined in parallel to the previously described data detection process of FIG. 7*a* whether a data decoder circuit is available to process a new data set (block 706). Where a data decoder circuit is available to process (block 706), it is determined whether a derivative of a detected output is available for processing in the central memory (block 711). Where such a data set is ready (block 711), the next derivative of a detected output is selected for processing (block 716). The selection of the next derivative of the detected output may be done in accordance with any scheduling or priority scheme known in the art. The selected derivative of the detected output is accessed from the central memory (block 721). A data decode algorithm is applied to the accessed detected output to yield a decoded output (block 726). Where a previous local iteration has been performed on the received codeword, the results of the previous local iteration (i.e., a previous decoded output) are used to guide application of the decode algorithm.

It is then determined whether the decoded output converged (i.e., resulted in the originally written data) (block 731). Where the decoded output converged (block 731), the decoder selector bits in the resulting decoded output are accessed (block 751). The selector bits are used to select a decoder that will be used to reverse a previously applied first level encoding (block 756), and the selected decoder is used to decode or decrypt the decoded output using the selected decoder to yield a processed output (block 761). It is then determined whether data compression was applied to the original data set (block 766). Where the original data set was not originally compressed as indicated by a compression bit included in the transferred data (block 766), the processed data set is provided as a data output (block 781). Alternatively, where the original data set was originally compressed (block 766), the processed output is decompressed to yield a decompressed output (block 771). The decompressed output is provided as a data output (block 776).

Alternatively, where the decoded output failed to converge (block 731), it is determined whether another local iteration is desired (block 736). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 736), the processes of blocks 726-731 are repeated for the accessed detected output. Alternatively, where another local iteration is not desired (block 736), a derivative of the decoded output is stored to the central memory (block 746). The derivative of the decoded output being stored to the central memory triggers the data set ready query of block 705 to begin the data detection process.

Following flow diagram 702 of FIG. 7*c*, data encoding is discussed that yields codewords that may be processed using the approaches discussed above in relation to FIGS. 7*a*-7*b*. It is determined whether data has been received for transfer to an encoding circuit (block 707). Where write data has been received (block 707), it is determined whether the received write data is to be compressed (block 712). Where the data is to be compressed (block 712), the received write data is compressed to yield a compressed output as a first level encoder input and a compression indication bit is added indicating the application of the compression (block 717). Alternatively, where the data is not to be compressed (block 712), the received write data is provided as the first level encoder input along with the compression indication bit indicating that compression was not performed (block 722).

A length of the first level encoder input is determined (block 727). Based upon the determined length, an encoder circuit that most closely matches the length is selected (block 732). The selected encoder is selected from one of a number of encoders that when used yields a length of first level encoder added information that can fit within an unused length of a first level encoded output of a defined length, and makes the best use of the unused length. As an example, where four encoders area available (an encoder A that generates a first level encoder added information of size A, an encoder B that generates a first level encoder added information of size B, an encoder C that generates a first level encoder added information of size C, and an encoder D that generates a first level encoder added information of size D), the first level encoder input is of size E, and the defined size of the first level encoded output is size F, then the selected encoder is selected in accordance with the following pseudocode that assumes size D is greater than size C, and size C is greater than size B, and size B is greater than size A:

```
If ([size F − size E] > size D){
    Select Encoder D;
}
Else if ([size F − size E] > size C){
    Select Encoder C;
}
Else if ([size F − size E] > size B){
    Select Encoder B;
}
Else {
    Select Encoder A;
}
```

Again, it should be noted that while the embodiment is described as relying on four encoders (encoder A, encoder B, encoder C, and encoder D), any number of encoders may be uses and selected between in accordance with different embodiments of the present invention.

The first level encoder input is encoded using the selected encoder to yield the first level encoded output (block 737). The first level encoding may be any type of encoding where the use of additional encoding information improves the ability to recover the encoded output. For example, the encoding may be run length limited encoding as is known in the art. Such run length encoding may allow for a first number of consecutive bits (i.e., a run) or symbols that may be repeated. Where the first level encoding is run length limited encoding, encoder A may allow for a first number of consecutive bits or symbols to repeat, encoder B may allow for a second number of consecutive bits or symbols to repeat, encoder C may allow for a third number of consecutive bits or symbols to repeat, and encoder D may allow for a fourth number of consecutive bits or symbols to repeat. Allowing a different number of consecutive bits to be repeated results in a change in the length of first level encoder added information with the smaller runs resulting in a larger length of first level encoder added information when compared with larger runs. Alternatively or in addition, the first level encoding may apply more redundant bits that may be used for error checking and/or correction for a given codeword. As yet another example, first level encoding may apply a variable length low density parity check encoding. Based upon the disclosure provided herein, one of ordinary skill in the art will recognize a variety of encoding algorithms that may apply encryption, modulation and/or error correction encoding that may be applied as the first level encoding in accordance with different embodiments of the present invention.

Selector bits identifying the selected encoder are added to the first level encoded output (block 747). These selector bits are used to select a corresponding decoder (see blocks 751, 756) when the data is subsequently decoded. A low density parity check encoding is applied is applied to the first level encoded output to yield a codeword (block 747), and the codeword is transferred to a recipient (block 752).

Figure 8:
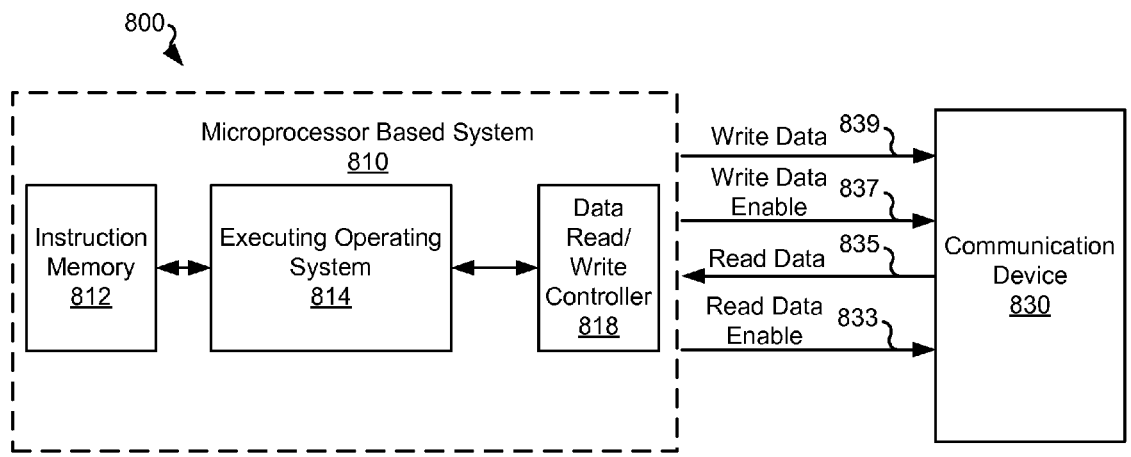
FIG. 8 shows an application device including a microprocessor based system operable to transfer information to/from a data communication device.

FIG. 8 shows an application device 800 including a microprocessor based system 810 operable to transfer information to/from a data communication device 830. Application device 800 may be, for example, a cell phone, a network device, a personal computer, a personal digital assistant, or any of a number of other devices known in the art that access information from a storage device. Microprocessor based system 810 includes a microprocessor having operating system execution modules generically referred to as an executing operating system 814 that accesses instructions to be executed from an instruction memory 812 that is loaded with data accessed from a storage device (not shown). As executing operating system 814 receives commands to transfer data via communication device 830, it prepares the data for transfer and writes the data to a data read/write controller 818. In addition, executing operating system 814 indicates a level of importance of the data being transferred to data read/write controller 818 by controlling the length of data transferred as a single block framed by write data enable 837. Data of greater importance is transferred in smaller blocks, while data of lower importance is transferred in larger blocks. Small blocks allow for more redundancy by the first level encoding discussed above in relation to FIG. 3 and FIG. 5. In contrast, large blocks allow for less redundancy by the first level encoding discussed above in relation to FIG. 3 and FIG. 5. In turn, data read/write controller 818 provides a write data 839 that is framed by a write data enable 837 to communication device 830.

Write data 839 and write data enable 837 are communicated to a receiving device (not shown) that processes the communicated write data and corresponding write data priority to yield the originally written data to a recipient (not shown). In some cases, the receiving device includes a data processing circuit similar to that discussed above in relation to FIG. 3 and FIG. 4, or FIG. 5 and FIG. 6. The data processing circuit described above in relation to FIG. 3 and FIG. 4 or FIG. 5 and FIG. 6 that may operate similar to that described above in relation to FIGS. 7a-7c. Examples of low importance data may include, but is not limited to, audio data or video data that when it includes errors is still playable and meaningful. In contrast, executable data or other more sensitive data may be identified as high importance data. Based upon the disclosure provided herein, one of ordinary skill in the art will recognize a variety of different data types that may be identified as low importance and other data types that may be identified as high importance in accordance with different embodiments of the present invention.

Receiving read data from communication device 830 is standard where read data 835 is received from communication device 830 and framed by a read data enable 833. The received data is provided to the appropriate applications operating on microprocessor based system 810. In some cases, communication device 830 receives communicated data that is processed and provided as read data 835 in accordance with a priority indication communicated along with the communicated data. In such cases, communication device 830 may include a data processing circuit similar to that discussed above in relation to FIG. 3 and FIG. 4, or FIG. 5 and FIG. 6. The data processing circuit described above in relation to FIG. 3 and FIG. 4 or FIG. 5 and FIG. 6 that may operate similar to that described above in relation to FIGS. 7a-7c.

Figure 9:
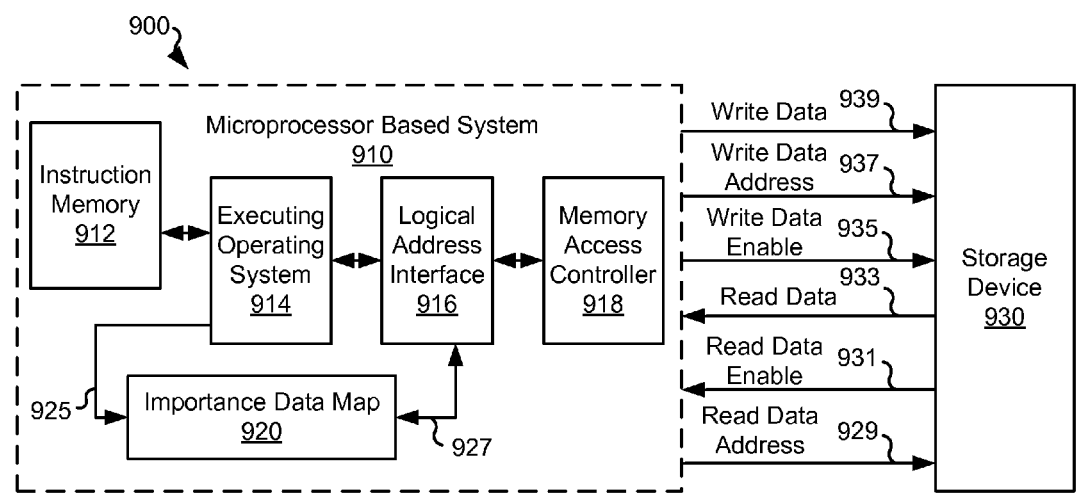
FIG. 9 shows another application device including a microprocessor based system operable to transfer information to/from a storage device.

Turning to FIG. 9, another application device 900 is shown that includes a microprocessor based system 910 operable to transfer information to/from a storage device 930. Application device 900 may be, for example, a personal computer, a personal digital assistant, an electronic application device, or any of a number of other devices known in the art that access information from a storage device. Microprocessor based system 910 includes a microprocessor that includes operating system execution modules generically referred to as an executing operating system 914 that accesses instructions to be executed from an instruction memory 912 that is loaded with data accessed from storage device 930 or another storage media (not shown). As executing operating system 914 identifies data that is required for operating, it formats a data request that includes a logical address of the requested data.

The data request is provided from executing operating system 914 to a logical address interface 916 that maps the logical address of the data request to a physical address that is provided to a memory access controller 918. In addition, logical address interface 916 also accesses an importance data map 920 to determine whether the requested data is high importance data or low importance data via a communication path 927. It should be noted that while the importance data map is described as indicating high importance data or low importance data, that additional levels of priority may also be used in relation to different embodiments of the present invention. Executing operating system 914 is responsible for identifying different logical blocks as high importance or low importance data is originally stored to storage device 930. This importance is written by executing operating system 914 to importance data map 920 via a communication path 925. For example, data which can accept some level of errors may be identified as low importance data in importance data map 920. Based upon this indication of low importance in importance data map 920, logical address interface 916 causes the data provided by executing operating system 914 to be transferred to storage device 930 via memory access controller 918 in larger blocks as indicated by write data enable 935 and the data provided as write data 939. This results in less redundancy being applied by a data processing circuit included in storage device 930. The data is stored to a location on storage device 930 corresponding to write data address 937. In contrast, data which is highly sensitive to errors may be identified as high importance data in importance data map 920. Based upon this indication of high importance in importance data map 920, logical address interface 916 causes the data provided by executing operating system 914 to be transferred to storage device 930 via memory access controller 918 in smaller blocks as indicated by write data enable 935 and the data provided as write data 939. This results in more redundancy being applied by a data processing circuit included in storage device 930. In some cases, storage device 930 includes a data processing circuit similar to that discussed above in relation to FIG. 3 and FIG. 4, or FIG. 5 and FIG. 6. Again, the data processing circuit described above in relation to FIG. 3 and FIG. 4, or FIG. 5 and FIG. 6 may operate similar to that described above in relation to FIGS. 7a-7c above. Examples of low importance data may include, but is not limited to, audio data or video data that when it includes errors is still playable and meaningful. In contrast, executables maintained on storage device 930 may be marked as high importance as they must be received without errors to assure that they operate properly. Based upon the disclosure provided herein, one of ordinary skill in the art will recognize a variety of different data types that may be identified as low importance and other data types that may be identified as high importance in accordance with different embodiments of the present invention. Logical address interface 916 provides the identified priority level along with the physical address to memory access controller 918.

Memory access controller 718 converts the request including priority indications as a read data priority 733 and read address 731 to storage device 730. In return, storage device 730 provides the request data as read data 735 to microprocessor based system 710 where it is used. As an example, read data 735 may include instructions executable a part of the operating system in which case microprocessor based system 710 stores the data to instruction memory 712 where it is maintained until it is needed.

Receiving data from microprocessor based system 910 uses a standard approach of providing a logical write address from executing operating system 914 to logical address interface 916 where the logical address is converted to a physical address that is provided to memory access controller 918 along with the data to be written. In such a case, memory access controller 918 provides a read data address 931 and a read data 935 framed by read data enable 933 from storage device 930. As part of this process, executing operating system 914 identifies the read data as high importance or low importance to importance data map 920. This importance information may be used later when a request to write the data is generated.

Figure 10:
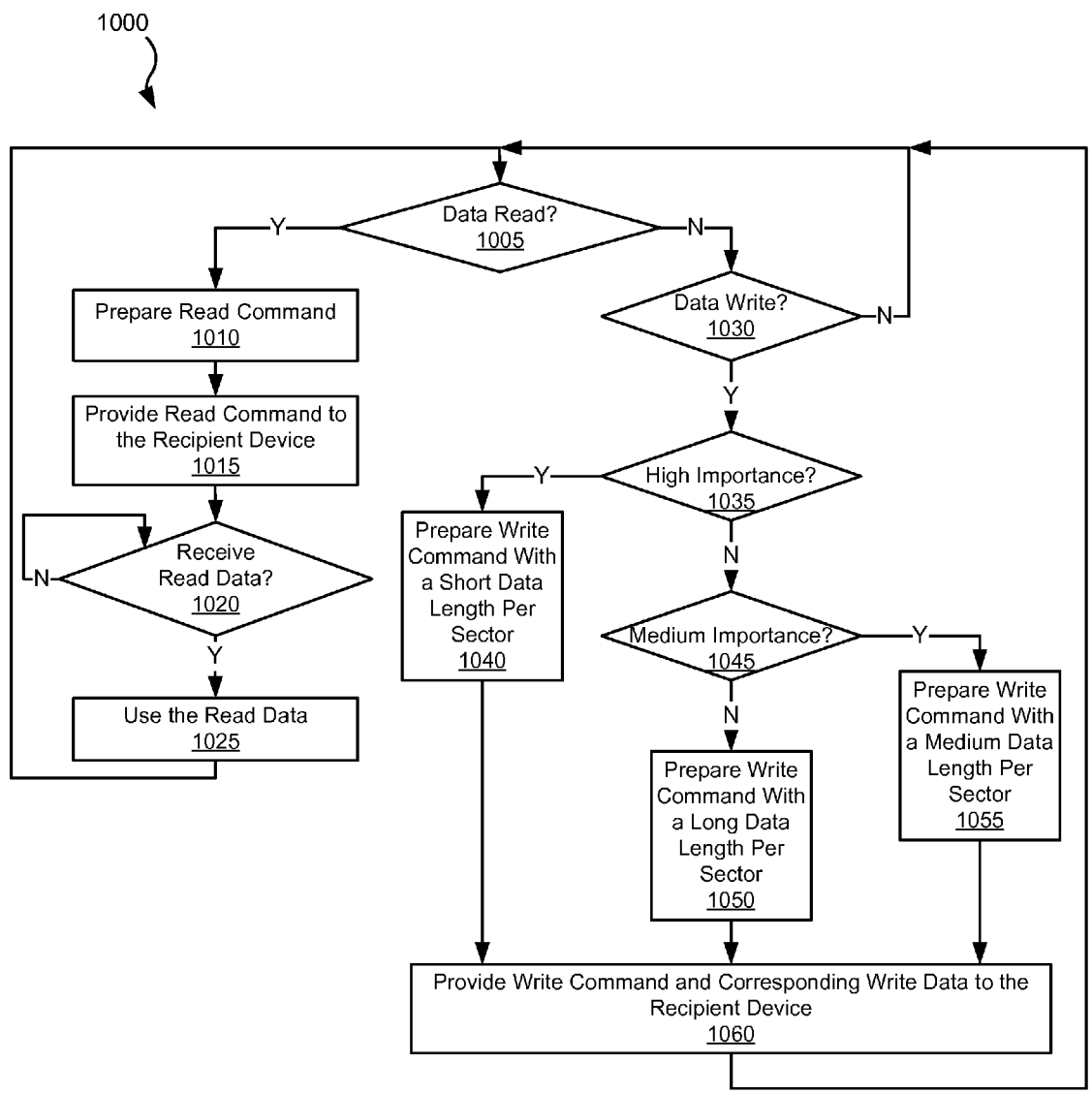
FIG. 10 is a flow diagram showing a method for variable length data transfer in accordance with one or more embodiments of the present invention.

Turning to FIG. 10, a flow diagram 1000 shows a method for variable length data transfer in accordance with one or more embodiments of the present invention. Following flow diagram 1000, it is determined if a data read is requested (block 1005). Where a data read is requested (block 1005), a read command is prepared (block 1010). The read command includes an address of the data that is to be read. The read command is provided to a recipient device (block 1015). The recipient device may be, but is not limited to, a storage device or some other application device. After providing the read command to the recipient device (block 1015), the device awaits reception of the requested data (block 1020). Once the data is received (1020), the received read data is used for the purposes that it was requested (block 1025).

Alternatively, where a data read is not requested (block 1005), it is determined whether a data write is requested (block 1030). Where a data write is requested (block 1030), the importance of the data to be written is determined. In some cases, the importance of the data is determined based upon the type of the data. For example, where the data is of a type that is less sensitive to errors such as, but not limited to, audio data or video data, it may be indicated as low importance data. Alternatively, executables that will not work in the event of any errors may be identified as high importance data. Other data types may be identified as medium importance data. Based upon the disclosure provided herein, one of ordinary skill in the art will recognize a variety of different data types that may be identified as low importance, other data types that may be identified as high importance, and other data types that may be identified as medium importance.

Where the data to be written is of high importance (block 1035), a high importance write command is prepared (block 1040). The write command includes a write address and the write data to be written. Because the write command is a high importance write command (block 1035), the amount of data included as the write data is relatively small compared with a medium importance write command or a low importance write command. This reduced amount of data results in an increased amount of first level encoder added information which offers additional protection to the data being written.

Alternatively, where the data to be written is not of high importance (block 1035), it is determined whether the data to be written is of medium importance (block 1045). Where the data to be written is of medium importance (block 1045), a medium importance write command is prepared (block 1055). The write command includes a write address and the write data to be written. Because the write command is a medium importance write command (block 1045), the amount of data included as the write data is relatively small compared with a high importance write command and relatively large compared with a low importance write command. This medium amount of data results in an increased amount of first level encoder added information compared with a low importance write command which offers additional protection to the data being written, and a decreased amount of first level encoder added information compared with a high importance write command which offers more efficient use of the storage area.

As yet another alternative, where the data to be written is not of medium importance (block 1045), a low importance write command is prepared (block 1050). The write command includes a write address and the write data to be written. Because the write command is a low importance write command (block 1045), the amount of data included as the write data is relatively small compared with both a high importance write command and a medium importance write command. This low amount of data results in a decreased amount of first level encoder added information compared with both a high importance write command and a medium importance write command which offers more efficient use of the storage area. Once the write command is prepared, it is provided to a recipient device that proceeds to operate on the write data in accordance with the command (block 1060).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for prioritizing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system, the system comprising:
    a host interface providing a write request, a write enable, and a data transfer set to be written to a storage device;
    a data transfer controller circuit operable to:
    count the length of the transfer set framed by the write enable to yield a length value;
    provide the transfer set as a data set;
    select a first level encoder based upon the counted length value, wherein an amount of redundancy to be stored to the storage device varies in relation to the data set.

2. The system of claim 1, wherein the length is varied between a first length and a second length, wherein the second length is greater than the first length, and wherein the first length is selected based upon a type of data included in the data set.

3. The system of claim 2, wherein the second length is selected when the data set is a second data type that is resilient to errors; and wherein the first length is selected when the data set is a first data type that is not resilient to errors.

4. The system of claim 3, wherein the first data type is selected from a group consisting of: audio data, and video data.

5. The system of claim 3, wherein the second type of data is an executable application.

6. The system of claim 1, wherein the data transfer controller circuit is implemented as part of a microprocessor based system including a microprocessor and a memory, wherein the memory includes instructions executable by the microprocessor to assign a processing importance, and wherein the data transfer controller circuit is operable to vary the amount of redundancy stored to the storage device in relation to the data set based at least in part on the processing importance.

7. The system of claim 6, wherein the microprocessor based system further comprises: an importance data map operable to store the assigned processing importance in relation to a portion of the data set.

8. The system of claim 1, wherein the first level encoder is operable to generate a first level encoded output, and wherein the system further comprises:
    a low density parity check encoding circuit operable to apply a low density parity check encoding to the first level encoded output to yield a codeword, wherein the first level encoded output includes a combination of information derived from:
        the data set;
        added encoding generated by the selected first level encoder; and
        an indication of the selected first level encoder;
    a low density parity check data decoder circuit operable to decode a decoder input derived from the codeword to yield the first level encoded output;
    a decoder circuit including at least a first decoder corresponding to the first level encoder; and
    a decoder selection circuit operable to select the first decoder based on the indication of the selected first level encoder.

9. A method for data transfer, the method comprising:
    selecting a data set for transfer;
    determining an importance of the data set;
    based at least in part on the determined importance, segregating a length of the data set to yield a transfer unit, wherein the length is selected based at least in part on the importance;
    providing the transfer unit to a transfer device: and
    wherein the transfer device; and
        receives the transfer unit, and counts the length of the transfer unit; and
        selects a first level encoder from at least two different encoders based upon the counted length.

10. The method of claim 9, wherein the transfer device is a storage device operable to encode and store the transfer unit.

11. The method of claim 9, wherein the transfer device is a communication device operable to encode and transmit the transfer unit.

12. The method of claim 9, wherein the importance is selected from a group consisting of: a high importance, and a low importance.

13. The method of claim 12, wherein the length is selected as a first length when the data set is a first data type that is resilient to errors; and wherein the length is selected as a second length when the data set is a second data type that is not resilient to errors.

14. The method of claim 13, wherein the second length is shorter than the first length.

15. The method of claim 9, wherein one of the two different encoders is operable to generate a first size of added encoding when applied to the data set and another of the two different encoders is operable to generate a second size of added encoding when applied to the data set; and encode the data set using the selected first level encoder.

16. A communication system, the system comprising:
a microprocessor based system operable to format a data set for transfer to a communication device, wherein the microprocessor based system includes a microprocessor and a memory, and wherein the memory includes instructions executable by the microprocessor to:
receive a data set for transmission;
determine a data type of the data set;
select a length of the data set based at least in part on the data type;
segregate a portion of the data set as a transfer data set, wherein the transfer data set is the selected length; and
provide the transfer data set to the communication device: and
wherein the communication device:
receives the transfer data set, and counts the length of the transfer data set; and
selects a first level encoder from at least two different encoders based upon the counted length.

17. The system of claim 16, wherein the length is varied between a first length and a second length; wherein the second length is greater than the first length; wherein the first length is associated with a first data type that is not resilient to errors; and wherein the second length is associated with a second data type that is resilient to errors.

18. The system of claim 17, wherein the first data type is selected from a group consisting of: audio data, and video data.

19. The system of claim 17, wherein the second type of data is an executable application.

* * * * *